(12) United States Patent
Miyamoto

(10) Patent No.: US 6,765,515 B2
(45) Date of Patent: Jul. 20, 2004

(54) ARITHMETIC CODING/DECODING APPARATUS OF MQ-CODER SYSTEM AND RENORMALIZATION METHOD

(75) Inventor: Rui Miyamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/376,069

(22) Filed: Feb. 27, 2003

(65) Prior Publication Data

US 2003/0217085 A1 Nov. 20, 2003

(30) Foreign Application Priority Data

Feb. 28, 2002 (JP) ....................................... 2002-054574

(51) Int. Cl.[7] .......................... H03M 7/00; G06K 9/36; G06K 9/46; G05F 7/00; G05F 15/00
(52) U.S. Cl. ..................... 341/107; 382/247; 708/205
(58) Field of Search .......................... 341/107, 51, 106, 341/59; 358/539; 382/247, 232; 708/203, 205; 702/181

(56) References Cited

U.S. PATENT DOCUMENTS

| | | | | |
|---|---|---|---|---|
| 4,935,882 A | * | 6/1990 | Pennebaker et al. | 702/181 |
| 6,144,320 A | * | 11/2000 | Van Der Vleuten | 341/50 |
| 6,225,925 B1 | * | 5/2001 | Bengio et al. | 341/107 |
| 6,580,379 B2 | * | 6/2003 | Van Der Vleuten et al. | 341/107 |
| 6,677,869 B2 | * | 1/2004 | Horie | 341/107 |

* cited by examiner

*Primary Examiner*—Patrick Wamsley
(74) *Attorney, Agent, or Firm*—Frommer Lawrence & Haug LLP; William S. Frommer

(57) ABSTRACT

In a renormalization processing device of MQ-CODER, the value of an augend register A is calculated by a shift quantity calculating unit without performing loop processing, and the number of left shifts SHIFT_A of A up to the end of renormalization processing is calculated. The renormalization processing device judges whether byteout processing or bytein processing occurs or not, on the basis of the positive or negative sign of (SHIFT_A-CT) and the value of CT. When byteout/bytein processing occurs, the values of a code register C and a free byte counter CT that are immediately before the occurrence of processing are found. When byteout/bytein processing does not occur, the values of C and CT that are after the end of normalization processing are found. If the value of (SHIFT_A-CT) is a positive value after byteout/bytein processing, this value is substituted in SHIFT_A and renormalization processing is performed again.

3 Claims, 6 Drawing Sheets

ARITHMETIC CODING/DECODING APPARATUS OF MQ-CODER SYSTEM AND RENORMALIZATION METHOD

BACKGROUND OF THE INVENTION

1. Field of the Invention

This invention relates to a normalization processing method used on a coding algorithm of MQ-CODER, which is an arithmetic coding system, and an arithmetic coding/decoding apparatus of the MQ-CODER system.

This application claims priority of Japanese Patent Application No.2002-054574, filed on Feb. 28, 2002, the entirety of which is incorporated by reference herein.

2. Description of the Related Art

As an arithmetic coding system, a coding system called MQ-CODER is known. This MQ-CODER is employed as an arithmetic coding system of JPEG2000 (ISO/IEC JTC 1/SC 29/WG1) or the like. This MQ-CODER coding/decoding algorithm is described in detail, for example, in the following literature:

"Next-Generation Image Coding System JPEG2000," (Triceps) issued on Feb. 13, 2001; and "JPEG2000 Part 1 Final Committee Draft Version 1.0," (SO/IEC JTC 1/SC 29/WG1, JPEG2000 Editor Martin Boliek, Co-editors, Charilaos Christopoulos and Eric Majani) issued on Apr. 11, 2000.

With this MQ-CODER coding/decoding algorithm, renormalization processing in coding (RENORME) and renormalization processing in decoding (RENORMD) are carried out. Renormalization processing in coding (RENORME) is used for the processing on the final stage of LPS coding (CODELPS) and MPS coding (CODEMPS). LPS means less predominant symbol and MPS means more predominant symbol. Renormalization processing in decoding (RENORMD) is used for the processing on the final stage of decoding processing (DECODE). In decoding processing (DECODE), the processing may end without carrying out this renormalization processing in decoding (RENORMD) depending on the results of segmentation and selection processing, which is carried out before renormalization processing in decoding (RENORMD). Also in some cases in coding processing (ENCODE), the processing may end without carrying out renormalization processing in coding (RENORME).

Hereinafter, renormalization processing in coding (RENORME) and renormalization processing in decoding (RENORMD) will be described. The data contents of A, C, BP, B, B1 and CT referred to in renormalization processing in coding (RENORME) and renormalization processing in decoding (RENORMD) are the same as the data contents described in the foregoing literature. The following are the details of the data contents.

A is a value stored in an augend register. It is binary data with a 16-bit length.

C is a value stored in a code register. It is binary data with a 28-bit length.

BP is a pointer of a byte buffer.

B is data of a position indicated by BP of a byte buffer. It is binary data with an 8-bit length.

B1 is data of a position indicated by BP+1 of a byte buffer. It is binary data with an 8-bit length.

CT is a value of a free byte counter for counting free bits. It is binary data with a 4-bit length.

An arithmetic formula "X>>Y" means that right bit shift of binary data X by Y bits is carried out. An arithmetic formula "X<<Y" means that left bit shift of binary data X by Y bits is carried out. "0xXX . . . X" means binary data of hexadecimal expression. X represents hexadecimal numbers 0 to F.

FIG. 3 shows a processing flow of renormalization processing in coding (RENORME).

In renormalization processing in coding (RENORME), first, left bit shift of A and C by 1 bit is carried out and 1 is subtracted from CT (step S11).

Then, whether CT is 0 or not is judged (step S12). If CT is 0, subroutine processing of byteout processing (BYTEOUT) of step S13 is carried out. When this subroutine of byteout processing (BYTEOUT) ends, the processing goes to step S14. If CT is not 0, the processing goes directly to step S14.

Next, arithmetic operation of (A&0x8000) is carried out and whether the result of this arithmetic operation is 0 or not is judged (step S14). That is, at step S14, whether MSB of A stored in an augend register is 1 or not is judged.

If the result of arithmetic operation at step S14 is 0, the processing is repeated again from step S11. If the result of arithmetic operation is not 0, this flow ends.

In short, in this renormalization processing in coding (RENORME), left bit shift precessing of the value of A stored in the augend register is carried out until the value of A reaches 0x8000 or more.

FIG. 4 shows a processing flow of byteout processing (BYTEOUT) at step S13 of the above-described renormalization processing in coding (RENORME).

In byteout processing (BYTEOUT), first, whether B is 0xFF or not is judged (step S21). If B is 0xFF, the processing goes to step S27. If B is not 0xFF, the processing goes to the next step S22.

Next, whether C is smaller than 0x8000000 or not is judged (step S22). If C is smaller than 0x8000000, the processing goes to step S26. If C is equal to or larger than 0x8000000, the processing goes to the next step S23.

Next, 1 is added to B (step S23).

Next, whether B is 0xFF or not is judged (step S24). If B is 0xFF, the processing goes to the next step S25. If B is not 0xFF, the processing goes to step S26.

Next, arithmetic operation of (C&0x7FFFFFF) is carried out and the result of this arithmetic operation is substituted in C (step S26). Then, the processing goes to step S27.

At step S26, 1 is added to BP and a value obtained by performing right bit shift of C by 19 bits is substituted in B. Then, arithmetic operation of (C&0x7FFFF) is carried out and its value is substituted in C. Then, 8 is substituted in CT.

At step S27, 1 is added to BP and a value obtained by performing right bit shift of C by 20 bits is substituted in B. Then, arithmetic operation of (C&07FFFFF) is carried out and its value is substituted in C. Then, 7 is substituted in CT.

In byteout processing (BYTEOUT), as the processing of step S26 or step S27 ends, the subroutine processing ends.

FIG. 5 shows a processing flow of renormalization processing in decoding (RENORMD).

In renormalization processing in decoding (RENORMD), first, whether CT is 0 or not is judged (step S31). If CT is 0, the processing goes to the subroutine of bytein processing (BYTEIN) of step S32. As this subroutine of bytein processing (BYTEIN) ends, the processing goes to step S33. If CT is not 0, the processing goes directly to step S33.

Next, left bit shift of A and C by 1 bit is carried out and 1 is subtracted from CT (step S33).

Then, arithmetic operation of (A&0x8000) is carried out and whether the result of this arithmetic operation is 0 or not is judged (step S34). That is, at step S34, whether MSB of A stored in an augend register is 1 or not is judged.

If the result of arithmetic operation at step S34 is 0, the processing is repeated again from step S31. If the result of arithmetic operation is not 0, this flow ends.

In short, in this renormalization processing in decoding (RENORMD), left bit shift precessing of the value of A stored in the augend register is carried out until the value of A reaches 0x8000 or more.

FIG. 6 shows a processing flow of bytein processing (BYTEIN) at step S32 of the above-described renormalization processing in decoding (RENORMD).

In bytein processing (BYTEIN), first, whether B is 0xFF or not is judged (step S41). If B is 0xFF, the processing goes to the next step S42. If B is not 0xFF, the processing goes to step S45.

Next, whether B1 is larger than 0x8F or not is judged (step S42). If B1 is larger than 0x8F, the processing goes to step S43. If B1 is equal to or smaller than 0x8F, the processing goes to the next step S44.

At step S43, 1 is added to BP, and C is added to a value obtained by performing right left bit shift of B by 9 bits. The result of this addition is substituted in C. Then, 7 is substituted in CT.

At step S44, 0xFF00 is added to C and the result of this addition is substituted in C. Then, 8 is substituted in CT.

At step S45, 1 is added to BP, and C is added to a value obtained by performing right left bit shift of B by 8 bits. The result of this addition is substituted in C. Then, 8 is substituted in CT.

In bytein processing (BYTEIN), as the processing of step S43, step S44 or step S45 ends, the subroutine processing ends.

Meanwhile, in the above-described renormalization processing in coding (RENORME) and renormalization processing in decoding (RENORMD), a loop for performing left bit shift of A by 1 bit is formed, and the processing goes out of the loop when the value of A reaches 0x8000 or more. Since loop processing is carried out for each bit shift, a larger quantity of bit shift takes a longer processing time and the time for processing a set of data (symbol, context) varies. Moreover, as different processing modules must be used for coding and decoding, the circuit scale based on software and hardware is increased.

SUMMARY OF THE INVENTION

In view of the foregoing status of the art, it is an object of the present invention to provide an arithmetic coding/decoding apparatus of the MQ-CODER system and a renormalization method that require a short processing time and a reduced circuit scale.

An arithmetic coding/decoding apparatus of the MQ-CODER system according to the present invention comprises renormalization means for performing renormalization processing in coding and renormalization processing is decoding based on the MQ-CODER system with reference to the values of an augend register A, a code register C and a free byte counter CT.

The renormalization means comprises: a number-of-shift calculation step of calculating the number of times of shift in the case where left shift of the value of the augend register A by 1 bit is performed until MSB reaches 1, and outputting the number of times as the number of shifts SHIFT_A; a first left bit shift step of performing left shift of the value of the augend register A by bits of the value indicated by the number of shifts SHIFT_A; a subtraction step of subtracting the value of the free byte counter CT from the number of shifts SHIFT_A; a byteout/bytein step of performing byteout processing in the case where the result of subtraction of the subtraction step is not negative at the time of coding, and performing bytein processing in the case where the result of subtraction of the subtraction step is not negative at the time of decoding and in the case where the value of the free byte counter CT is not 0 and the value of the free byte counter CT and the number of shifts SHIFT_A are the same value and normalization is carried out, at the time of decoding; a second left bit shift step of performing left shift of the code register C by bits of the value indicated by the free byte counter CT in the case where byteout processing or bytein processing is performed at the byteout/bytein step, and performing left shift of the code register C by bits of the value indicated by the number of shifts SHIFT_A in the case where byteout processing or bytein processing is not performed at the byteout/bytein step; a CT value selection step of setting the absolute value of the result of subtraction of the subtraction step as the value of the free byte counter CT in the case where byteout processing or bytein processing is not performed at the byteout/bytein step, and setting the value of the free byte counter CT at 0 in the case where byteout processing or bytein processing is performed at the byteout/bytein step; and a number-of-remaining-loop selection step of setting the value of the number of shifts SHIFT_A at 0 in the case where byteout processing or bytein processing is not performed at the byteout/bytein step, and setting the absolute value of the result of subtraction of the subtraction step as the number of shifts SHIFT_A in the case where byteout processing or bytein processing is performed at the byteout/bytein step. The renormalization means ends the processing if the value of the number of shifts SHIFT_A outputted from the number-of-remaining-loop selection step is 0, and repeats the processing from the subtraction step if the value of the number of shifts SHIFT_A is not 0.

In this arithmetic coding/decoding apparatus of the MQ-CODER system, the value of the augend register A is calculated without performing any loop processing. In this arithmetic coding/decoding apparatus of the MQ-CODER system, whether byteout processing or bytein processing occurs or not is judged on the basis of the positive or negative sign of (number of shifts SHIFT_A minus free byte counter CT) and the value of the free byte counter CT. If byteout processing or bytein processing occurs, the values of the code register C and the free byte counter CT before this byteout processing or bytein processing are calculated. If byteout processing or bytein processing does not occur, the values of the code register C and the free byte counter CT up to the end of normalization processing are calculated. Then, if the value of (number of shifts SHIFT_A minus free byte counter CT) is a positive value after byteout processing or bytein processing, the result of this subtraction is substituted in the number of shifts SHIFT_A and renormalization processing is performed again.

A renormalization method according to the present invention is a renormalization method used in arithmetic coding/decoding processing of the MQ-CODER system for performing renormalization processing in coding and renormalization processing in decoding with reference to the values of au augend register A, a code register C and a free byte counter CT.

This renormalization method comprises: a number-of-shift calculation step of calculating the number of times of shift in the case where left shift of the value of the augend register A by 1 bit is performed until MSB reaches 1, and outputting the number of times as the number of shifts SHIFT_A; a first left bit shift step of performing left shift of the value of the augend register A by bits of the value indicated by the number of shifts SHIFT_A; a subtraction step of subtracting the value of the free byte counter CT from the number of shifts SHIFT_A; a byteout/bytein step of performing byteout processing in the case where the result of subtraction of the subtraction step is not negative at the time of coding, and performing bytein processing in the case where the result of subtraction of the subtraction step is not negative at the time of decoding and in the case where the value of the free byte counter CT is not 0 and the value of the free byte counter CT and the number of shifts SHIFT_A are the same value and normalization is carried out, at the time of decoding; a second left bit shift step of performing left shift of the code register C by bits of the value indicated by the free byte counter CT in the case where byteout processing or bytein processing is performed at the byteout/bytein step, and performing left shift of the code register C by bits of the value indicated by the number of shifts SHIFT_-A in the case where byteout processing or bytein processing is not performed at the byteout/bytein step; a CT value selection step of setting the absolute value of the result of subtraction of the subtraction step as the value of the free byte counter CT in the case where byteout processing or bytein processing is not performed at the byteout/bytein step, and setting the value of the free byte counter CT at 0 in the case where byteout processing or bytein processing is performed at the byteout/bytein step; and a number-of-remaining-loop selection step of setting the value of the number of shifts SHIFT_A at 0 in the case where byteout processing or bytein processing is not performed at the byteout/bytein step, and setting the absolute value of the result of subtraction of the subtraction step as the number of shifts SHIFT_A in the case where byteout processing or bytein processing is performed at the byteout/bytein step. The processing ends if the value of the number of shifts SHIFT_A outputted from the number-of-remaining-loop selection step is 0, and the processing is repeated from the subtraction step if the value of the number of shifts SHIFT_A is not 0.

In this renormalization method, the value of the augend register A is calculated without performing any loop processing. In this renormalization method, whether byteout processing or bytein processing occurs or not is judged on the basis of the positive or negative sign of (number of shifts SHIFT_A minus flee byte counter CT) and the value of the free byte counter CT. If byteout processing or bytein processing occurs, the values of the code register C and the free byte counter CT before this byteout processing or bytein processing are calculated. If byteout processing or bytein processing does not occur, the values of the code register C and the free byte counter CT up to the end of normalization processing are calculated. Then, if the value of (number of shifts SHIFT_A minus free byte counter CT) is a positive value after byteout processing or bytein processing, the result of this subtraction is substituted in the number of shifts SHIFT_A and renormalization processing is performed again.

In the arithmetic coding/decoding apparatus of the MQ-CODER system and the renormalization method according to the present invention, the value of the augend register A is calculated without performing any loop processing. According to the present invention, whether byteout processing or bytein processing occurs or not is judged on the basis of the positive or negative sign of (number of shifts SHIFT_A minus free byte counter CT) and the value of the free byte counter CT. If byteout processing or bytein processing occurs, the values of the code register C and the free byte counter CT before this byteout processing or bytein processing are calculated. If byteout processing or bytein processing does not occur, the values of the code register C and the free byte counter CT up to the end of normalization processing are calculated. Then, if the value of (number of shifts SHIFT_A minus free byte counter CT) is a positive value after byteout processing or bytein processing, the result of this subtraction is substituted in the number of shifts SHIFT_A and renormalization processing is performed again.

Thus, according to the present invention, the processing time can be reduced and the circuit scale can be reduced.

Moreover, according to the present invention, the value of the augend register A is calculated without performing any loop processing, and if byteout processing or bytein processing occurs, the values of the code register C and the free byte counter CT before this byteout processing or bytein processing are calculated, and if byteout processing or bytein processing does not occur, the values of the code register C and the free byte counter CT up to the end of normalization processing are calculated. Therefore, renormalization processing in coding (RENORME) and renormalization processing in decoding (RENORMD) can be performed in a common circuit.

Furthermore, according to the present invention, if byteout processing or bytein processing occurs, the processing before this byteout processing or bytein processing is performed without any loop operation, and if byteout processing or bytein processing does not occur, the processing up to the end of normalization processing is performed without any loop operation. Therefore, the time for processing each data can be made even.

DESCRIPTION OF THE PREFERRED EMBODIMENT

As an embodiment of the present invention, a renormalization processing device to which the present invention is applied will now be described. The renormalization processing device of this embodiment is a device for performing renormalization processing of a coding/decoding algorithm of MQ-CODER, which is an arithmetic coding system. In short, the renormalization processing device of this embodiment is a device for performing renormalization processing in coding (RENORME) and renormalization processing in decoding (RENORMD).

Figure 1:
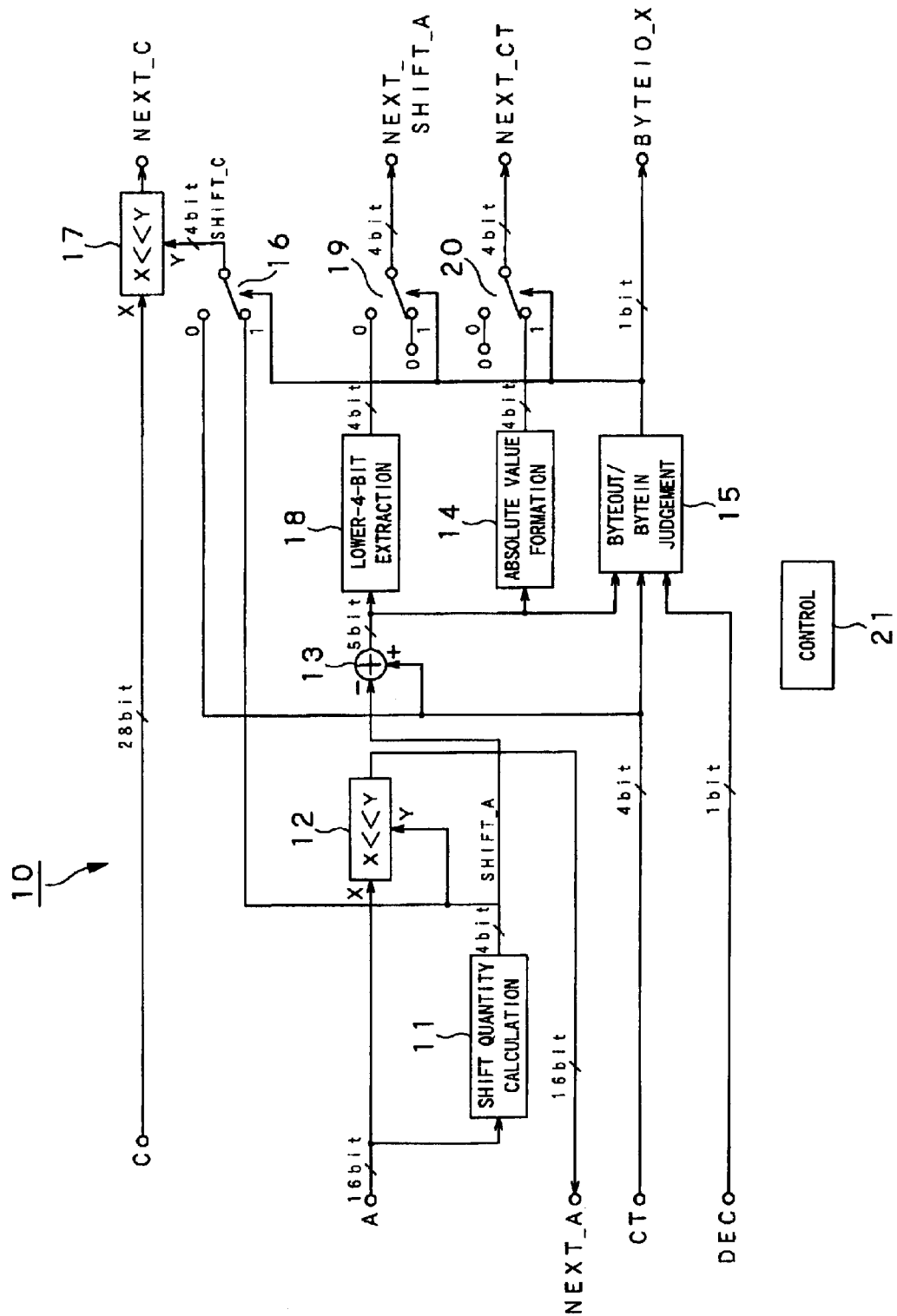
FIG. 1 is a circuit diagram showing a renormalization processing device of an embodiment of the present invention.

FIG. 1 shows a circuit diagram of a renormalization processing device 10 of this embodiment.

The renormalization processing device 10 has a shift quantity calculating unit 11, a first left bit shifter 12, a subtracter 13, an absolute value forming unit 14, a byteout/bytein judging unit 15, a shift quantity selection switch 16, a second left bit shifter 17, a lower-4-bit extracting unit 18, a number-of-remaining-loop selection switch 19, a CT selection switch 20, and a control unit 21.

To the renormalization processing device 10, values stored in an augend register A, a code register C, and a free byte counter CT are inputted at each one-data processing step, that is, at each processing step of one symbol and context. These values are inputted to the renormalization processing device 10 at each one-data processing step, that is, at each processing step of one symbol and context. 16-bit binary data is stored in the augend register A. 28-bit binary data is stored in the code register C. 4-bit binary data is stored in the free byte counter CT.

Also a DEC signal for identifying whether the present operation is coding processing or decoding processing is inputted to the renormalization processing device 10.

To the shift quantity calculating unit 11, the 16-bit value, of the augend register A is inputted. The shift quantity calculating unit 11 calculates the quantity of shift of left bit shift that is made until renormalization processing of the value of the augend register A ends. Specifically, the shift quantity calculating unit 11 calculates the number of bits whereby left shift of the value of the augend register A is made until A becomes equal to or larger than 0x8000, that is, until MSB of A reaches 1. The number of times of left bit shift until MSB of A reaches 1 can be calculated from the first bit position where 1 is detected by scanning the values of the respective bits of A from the MSB side. When LSB of A is defined as the $0^{th}$ bit and MSB of A is defined as the $15^{th}$ bit, if the first bit position where 1 is detected by scanning the values of the respective bits from MSB is the $15^{th}$ bit, the number of left bit shifts is 0. If the first bit position where 1 is detected is the $14^{th}$ bit, the number of left bit shifts is 1. If it is the $13^{th}$ bit, the number of left bit shifts is 12. If it is the $0^{th}$ bit, the number of left bit shifts is 15. The shift quantity calculating unit 11 outputs the number of left bit shifts thus calculated, as the number of shifts SHIFT_A. The number of shifts SHIFT_A outputted from the shift quantity calculating unit 11 indicates the number of times the loop operation of renormalization processing in coding (RENORME) and renormalization processing in decoding (RENORMD) should be performed.

To the first left bit shifter 12, the value of the augend register A and the number of shifts SHIFT_A outputted from the shift quantity calculating unit 11 are inputted. The first left bit shifter 12 performs left bit shift of the value of A by SHIFT_A bits. That is, the first left bit shifter 12 performs the following arithmetic operation. A<<SHIFT_A The first left bit shifter 12 outputs lower 16 bits (NEXT_A) of the value after performing left bit shift thereof. This value of lower 16 bits (NEXT_A) is stored into the augend register A as the result of renormalization. In the renormalization processing device 10; the value of A after renormalization is calculated without considering whether byteout processing or bytein processing occurs or not. This is because the value of A does not change even if byteout processing and bytein processing are performed.

To the subtracter 13, the number of shifts SHIFT_A and the value of the free byte counter CT are inputted. The subtracter 13 subtracts the value of the free byte counter CT from the number of shifts SHIFT_A. That is, the subtracter 13 performs the following arithmetic operation. SHIFT_A-CT An output value of the subtracter 13 is outputted as a value with a positive or negative sign. Since both the values of SHIFT_A and CT are 4-bit values, the output value of the subtracter 13 is expressed by 5 bits. The upper 1 bit represents a positive or negative sign and the remaining 4 bits represent the value of an absolute value part. The positive or negative sign of the upper 1 bit is 1 when the result of arithmetic operation by the subtracter 13 is negative. The positive or negative sign is 0 when the result of arithmetic operation is positive.

In the first renormalization processing before byteout processing or bytein processing occurs, the number of shifts SHIFT_A inputted to the subtracter 13 is the value outputted from the shift quantity calculating unit 11. However, in the subsequent renormalization processing after byteout processing or bytein processing, the number of shifts SHIFT_A becomes the value of NEXT_SHIFT_A, which indicates the number of remaining loops outputted from the number-of-remaining-loop selection switch 19.

The absolute value forming unit 14 forms an absolute value of the output value (5 bits) from the subtracter 13. The bit width of the value outputted from the absolute value forming unit 14 has not sign bit and is therefore 4 bits.

The byteout/bytein judging unit 15 judges whether byteout processing (BYTEOUT) or bytein processing (BYTEIN) occurs or not. To the byteout/bytein judging unit 15, the value of the free byte counter CT, the output value of the subtracter 13 and the DEC signal are inputted. Although the value of the free byte counter CT is updated in accordance with the output value from the CT selection switch 20, the value of the free byte counter CT inputted to the byteout/bytein judging unit 15 is a value prior to the update.

The byteout/bytein judging unit 15 judges whether the present processing is coding processing or decoding processing, on the basis of the DEC signal.

In coding processing, the byteout/bytein judging unit 15 judges that byteout processing does not occur when the sign bit of the output value of the subtracter 13 is 1, that is, when CT is larger than SHIFT_A. The byteout/bytein judging unit 15 judges that byteout processing occurs when the sign bit of the output value of the subtracter 13 is 0, that is, when CT is equal to or smaller than SHIFT_A. This is because byteout processing occurs only when CT becomes 0 during left bit shift of A up to when A becomes equal to or larger than 0x8000.

In decoding processing, the byteout/bytein judging unit 15 judges that bytein processing does not occur when the sign bit of the output value of the subtracter 13 is 1, that is, when CT is larger than SHIFT_A. In decoding processing, the byteout/bytein judging unit 15 also judges that bytein processing does not occur when the value of the free byte counter CT before being updated by the CT selection switching is not 0 and CT is equal to SHIFT_A, even when the sign bit of the output value of the subtracter 13 is 0. Otherwise, the byteout/bytein judging unit 15 judges that bytein processing occurs. The reason why bytein processing does not occur when CT is equal to SHIFT_A in decoding processing is that bytein processing is followed by left bit shift processing of A and countdown processing of CT.

The byteout/bytein judging unit 15 outputs BYTEIO_X as a signal indicating whether byteout processing or bytein processing occurs or not. When byteout processing or bytein processing occurs, the byteout/bytein judging unit 15 outputs BYTEIO_X=0. When byteout processing or bytein processing does not occur, the byteout/bytein judging unit 15 outputs BYTEIO_X=1.

The shift quantity selection switch 16 is a switch for selecting the number of shifts SHIFT_A for left bit shift of the value of the code register C. A selection signal for the shift quantity selection switch 16 is BYTEIO_X outputted from the byteout/bytein judging unit 15. When byteout processing or bytein processing occurs, the shift quantity selection switch 16 selects the value of the free byte counter CT and outputs this value of the free byte counter CT as the number of shifts SHIFT_A. That is, when byteout processing or bytein processing occurs, the free byte counter CT indicating the number of loops of renormalization processing up to immediately before occurrence of byteout processing or bytein processing is selected as the number of shifts of the code register C. When byteout processing or bytein processing does not occur, the shift quantity selection switch 16 selects the number of shifts SHIFT_A and outputs this number of shifts SHIFT_A as the number of shifts SHIFT_C.

The number of shifts SHIFT_A inputted to the shift quantity selection switch 16 is the value outputted from the shift quantity calculating unit 11 in the first renormalization processing before occurrence of byteout processing or bytein processing. However, in the subsequent renormalization processing after byteout processing or bytein processing, the value of NEXT_SHIFT_A indicating the number of remaining loops outputted from the number-of-remaining-loop selection switch 19 is used.

The selection signal inputted to the shift quantity selection switch 16 may be the sign bit of the result of arithmetic operation by the subtracter 13, instead of BYTEIO_X outputted from the byteout/bytein judging unit 15.

To the second left bit shifter 17, the 28-bit value of the code register C and the number of shifts SHIFT_C selected by the shift quantity selection switch 16 are inputted. The second left bit shifter 17 performs left bit shift of the value of C by SHIFT_C bits. That is, the second left bit shifter 17 performs the following arithmetic operation.

C<<SHIFT_C

The value of lower 28 bits (NEXT_C) of the value outputted from the second left bit shifter 17 is stored into the code register C. If renormalization is performed again after byteout processing or bytein processing is performed, the value of the code register C updated by NEXT_C is inputted to the renormalization processing device 10.

The lower-4-bit extracting unit 18 extracts lower 4 bits of the output value (5 bits) of the subtracter 13. The output value of the subtracter 13 has 5 bits in total and the upper 1 bit represents the sign bit. Therefore, extracting the lower 4 bits means extracting the absolute value part of the output value of the subtracter 13.

The number-of-remaining-loop selection switch 19 is a switch for selecting the number of remaining loops NEXT_SHIFT_A after byteout processing or bytein processing occurs. A selection signal for the number-of-remaining-loop selection switch 19 is BYTEIO_X outputted from the byteout/bytein judging unit 15. When byteout processing or bytein processing occurs, the number-of-remaining-loop selection switch 19 selects the value outputted from the lower-4-bit extracting unit 18 and outputs this output value of the lower-4-bit extracting unit 18 as the number of remaining loops NEXT_SHIFT_A. Specifically, though loop processing is supposed to be performed SHIFT_A times in renormalization processing, when byteout processing or bytein processing occurs, loop processing ends as it is performed CT times. Therefore, SHIFT_A-CT is selected as the number of remaining loops. When byteout processing or bytein processing does not occur, the number-of-remaining-loop selection switch 19 selects 0 and outputs this value of 0 as the number of remaining loops NEXT_SHIFT_A. This is because loop processing has already been performed SHIFT_A times and the number of remaining loops is 0 when byteout processing and bytein processing do not occur.

The selection signal inputted to the number-of-remaining-loop selection switch 19 may be the sign bit of the result of arithmetic operation by the subtracter 13, instead of BYTEIO_X outputted from the byteout/bytein judging unit 15.

The CT selection switch 20 is a switch for selecting an update value NEXT_CT of the free byte counter CT. A selection signal for the CT selection switch 20 is BYTEIO_X outputted from the byteout/bytein judging unit 15. When byteout processing or bytein processing occurs, the CT selection switch 20 selects 0 and outputs this value of 0 as the update value NEXT_CT of the free byte counter CT. This is because the value of the free byte counter CT is 0 whenever byteout processing or bytein processing occurs. When byteout processing or bytein processing does not occur, the CT selection switch 20 selects the value outputted from the absolute value forming unit 14 and outputs this value outputted from the absolute value forming unit 14 as the update value NEXT_CT of the free byte counter CT. This is because the value of CT after performing loop processing SHIFT_A times is CT-SHIFT_A when byteout processing or bytein processing does not occur.

The selection signal inputted to the CT selection switch 20 may be the sign bit of the result of arithmetic operation by the subtracter 13, instead of BYTEIO_X outputted from the byteout/bytein judging unit 15.

Figure 4:
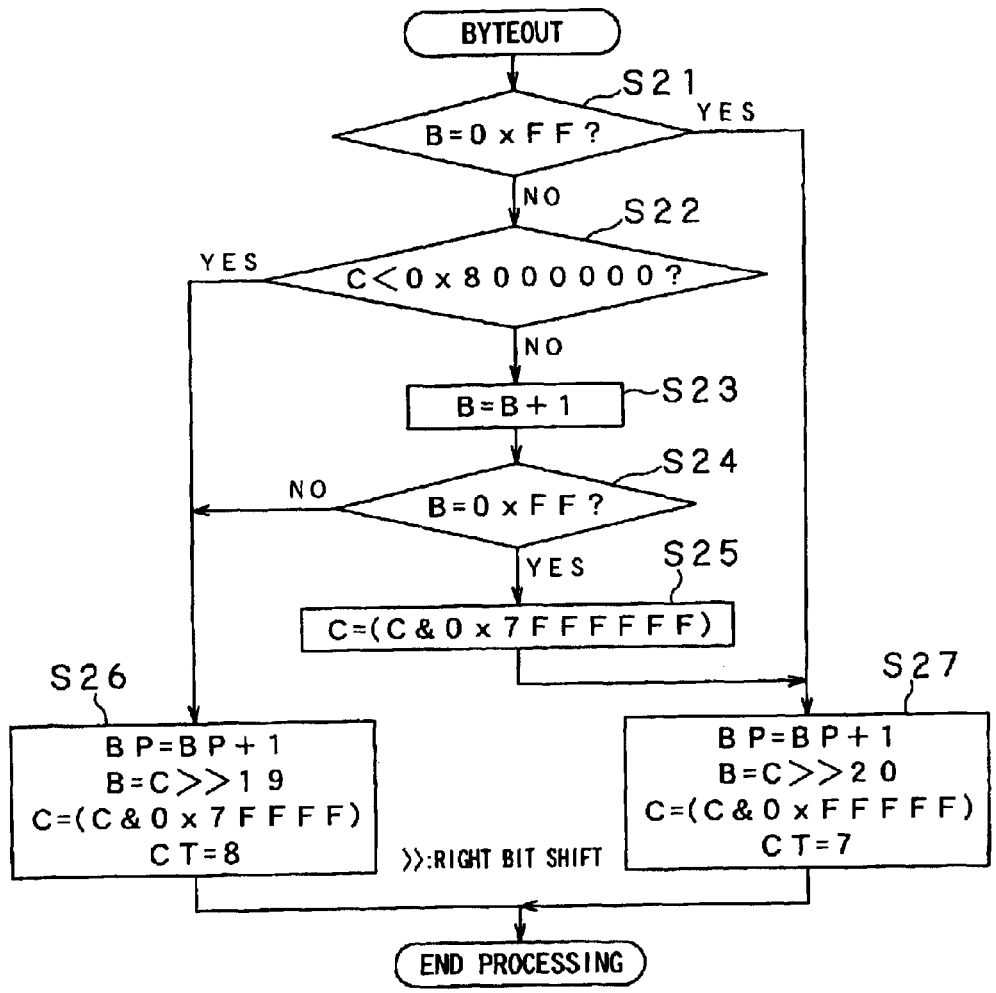
FIG. 4 is a flowchart of byteout processing.
Figure 5:
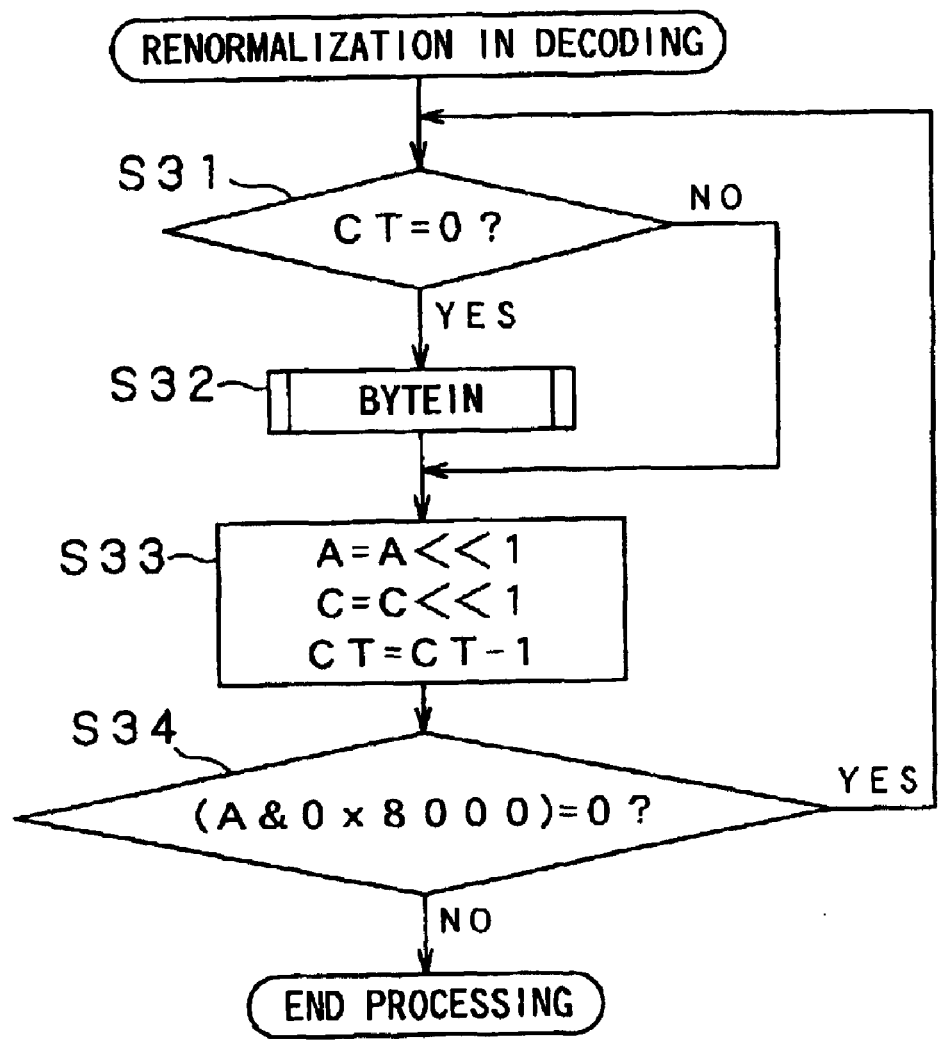
FIG. 5 is a flowchart of renormalization processing in decoding.
Figure 6:
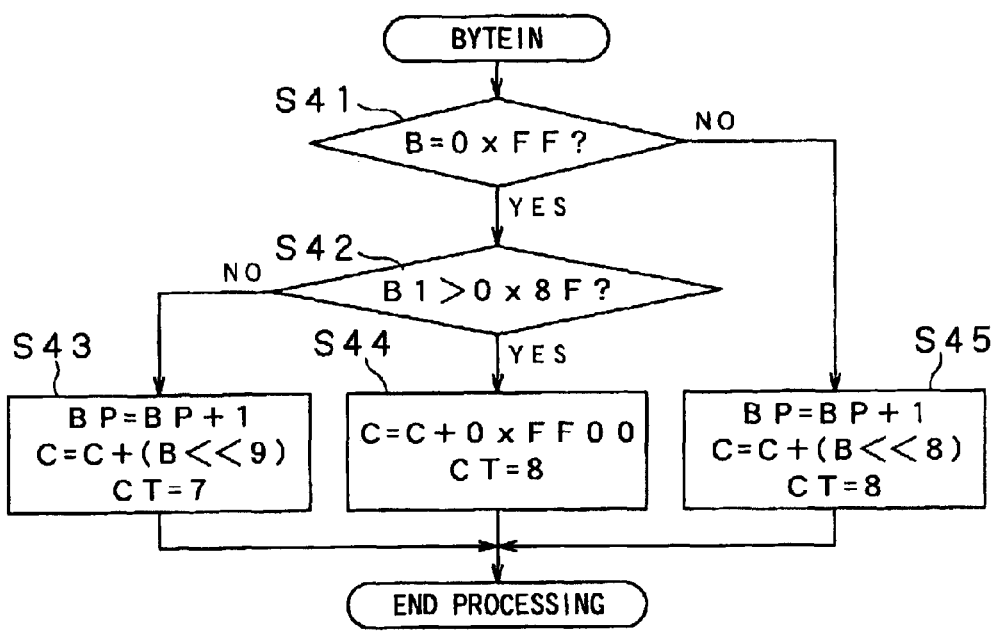
FIG. 6 is a flowchart of bytein processing.

The control unit 21 carries out byteout processing shown in FIG. 4 or bytein processing shown in FIG. 6 in accordance with BYTEIO_X outputted from the byteout/bytein judging unit 15. When BYTEIO_X is 1, the control unit. 21 ends this renormalization processing. When BYTEIO_X is 0 in coding, the control unit 21 carries out byteout processing. When BYTEIO_X is 0 in decoding, the control unit 21 carries out bytein processing. The control unit 21 also judges the value of the number of remaining loops NEXT_SHIFT_A after performing byteout processing or bytein processing, and if the value of the number of remaining loops NEXT_SHIFT_A is 0, the control unit 21 ends this renormalization processing. If the value of the number of remaining loops NEXT_SHIFT_A is not 0 (that is, 1 or more), the control unit 21 substitutes the value of the number of remaining loops NEXT_SHIFT_A in the above-described number of shifts SHIFT_A and again carries out the renormalization processing of this circuit. That is, the value of the number of remaining loops NEXT_SHIFT_A is used for judging whether the second or further byteout processing or bytein processing is performed or not after byteout processing or bytein processing occurs.

Figure 2:
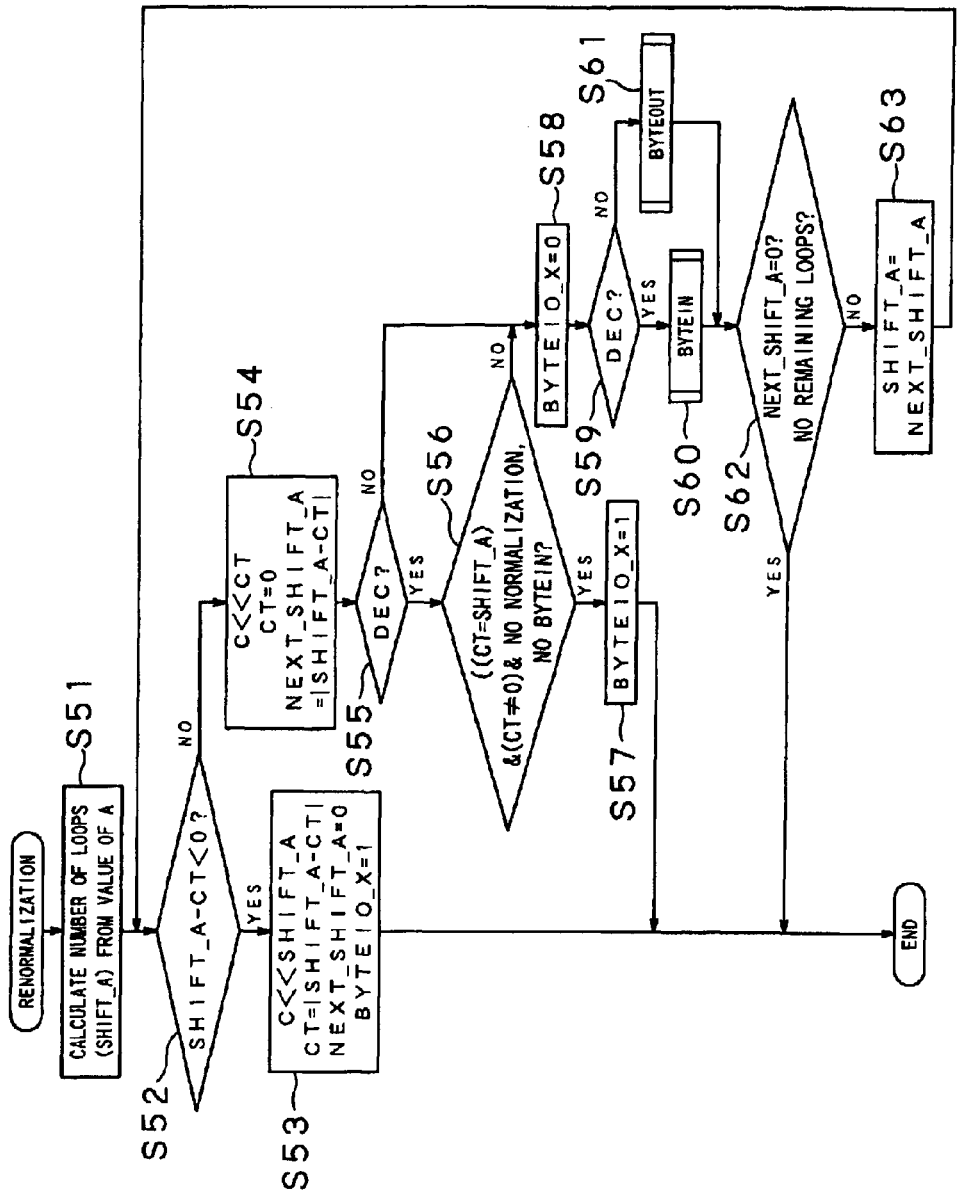
FIG. 2 is a flowchart showing the processing contents of the renormalization processing device.
Figure 3:
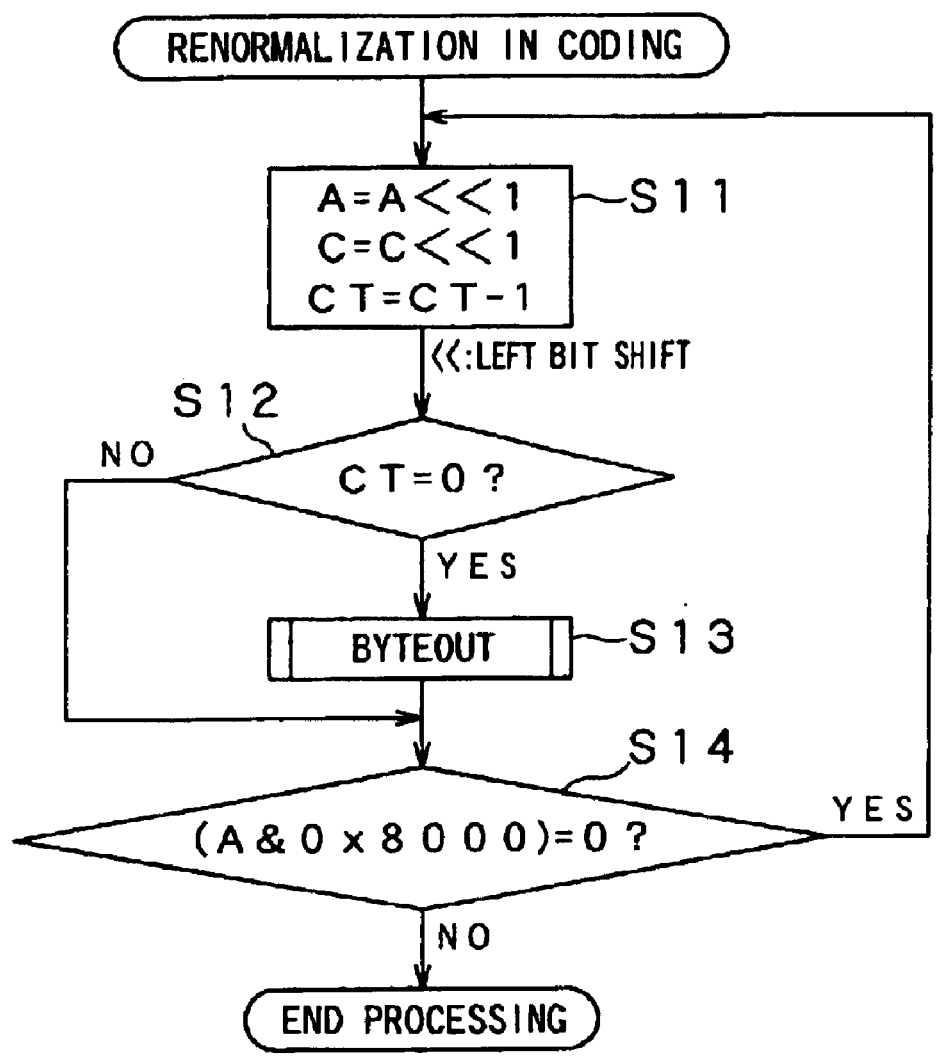
FIG. 3 is a flowchart of renormalization processing in coding.

FIG. 2 shows a renormalization processing flow carried out in the above-described renormalization processing device 10.

As renormalization processing starts, the renormalization processing device 10 performs the processing from the following step S51.

First, at step S51, the number of loops (SHIFT_A) is calculated from the value of the augend register A. Then; at step S52, whether SHIFT_A-CT is smaller than 0 or not is judged. If SHIFT_A-CT is smaller than 0, the processing goes to step S53. If SHIFT_A-CT is equal to or larger than 0, the processing goes to step S54.

At step S53, the following arithmetic operation is performed.

C<<SHIFT_A
CT=|SHIFT_A-CT|
NEXT_SHIFT_A=0
BYTEIO_X=1

As the arithmetic operation of step S53 ends, the renormalization processing device 10 ends the renormalization processing.

At step S54, the following arithmetic operation is performed.

C<<CT
CT=0
NEXT_SHIFT_A=|SHIFT_A-CT|

As the processing of step S54 ends, the processing goes to step S55.

At step S55, whether the present processing is decoding processing or not is judged. If it is decoding processing, the processing goes to step S56. If it is coding processing, the processing goes to step S58.

At step S56, it is judged whether ((CT=SHIFT_A)&(CT≠0)) holds and normalization does not occur. That is, whether bytein processing occurs or not is judged. The value of CT judged in this case is not 0 that is substituted at step S54 but the value prior to substitution of 0 at step S54. If ((CT=SHIFT_A)&(CT≠0)) holds, that is, if bytein processing does not occur, the processing goes to step S57. If ((CT=SHIFT_A)&(CT≠0)) does not hold, that is, if bytein processing occurs, the processing goes to step S58.

At step S57, 1 is substituted in BYTEIO_X. As this processing of step S57 ends, the renormalization processing device 10 ends the renormalization processing.

At step S58, 0 is substituted in BYTEIO_X. Then, at step S59, whether the present processing is decoding processing or not is judged. If it is decoding processing, a subroutine of bytein processing is accessed at step S60, thus carrying out the processing. As bytein processing ends, the processing goes to step S62. If the present processing is coding processing, a subroutine of byteout processing is accessed at step S61, thus carrying out the processing. As byteout processing ends, the processing goes to step S62.

At step S62, whether NEXT_SHIFT_A is 0 or not is judged. That is, whether the number of remaining loops is 0 or not is judged. If NEXT_SHIFT_A is 0, the renormalization processing device 10 ends the renormalization processing. If NEXT_SHIFT_A is not 0, the processing goes to step S63.

At step S63, NEXT_SHIFT_A is substituted in SHIFT_A.

As this processing of step S63 ends, the renormalization processing device 10 repeats the processing from step S52.

As described above, the renormalization processing device 10 whether byteout processing (BYTEOUT) or bytein processing (BYTEIN) occurs or not, during renormalization processing. When byteout processing or bytein processing occurs, the renormalization processing device 10 carries out processing to shift the values of the code register C and the free byte counter CT to the values that are immediately before the occurrence of byteout processing and bytein processing. When byteout processing or bytein processing does not occur, the renormalization processing device 10 carries out processing to shift the values of the code register C and the free byte counter CT to the values that are after the end of normalization. Moreover, the renormalization processing device 10 carries out processing to shift the value of the augend register A to the value that is after the end of normalization, irrespective of whether byteout processing or bytein processing occurs or not. This is because the augend register A is not affected by byteout processing and bytein processing.

Moreover, after bytein processing or byteout processing ends, the renormalization processing device 10 performs renormalization processing again and shifts the states of the code register C and the free byte counter CT. In this case, the renormalization processing device 10 handles only the number of remaining loops NEXT_SHIFT_A of renormalization processing, without using the value of the augend register A. Therefore, the renormalization processing device 10 can perform processing without having to calculate the shift quantity SHIFT_A from the value of the augend register A after byteout processing or bytein processing.

While the invention has been described in accordance with a certain preferred embodiment thereof illustrated in the accompanying drawings and described in the above description in detail, it should be understood by those ordinarily skilled in the art that the invention is not limited to the embodiment, but various modifications, alternative constructions or equivalents can be implemented without departing from the scope and spirit of the present invention as set forth and defined by the appended claims.

What is claimed is:

1. An arithmetic coding/decoding apparatus of the MQ-CODER system comprising renormalization means for performing renormalization processing in coding and renormalization processing is decoding based on the MQ-CODER system with reference to the values of an augend register A, a code register C and a free byte counter CT, the renormalization means comprising:
a number-of-shift calculation step of calculating the number of times of shift in the case where left shift of the value of the augend register A by 1 bit is performed until MSB reaches 1, and outputting the number of times as the number of shifts SHIFT_A;
a first left bit shift step of performing left shift of the value of the augend register A by bits of the value indicated by the number of shifts SHIFT_A;
a subtraction step of subtracting the value of the free byte counter CT from the number of shifts SHIFT_A;
a byteout/bytein step of performing byteout processing in the case where the result of subtraction of the subtraction step is not negative at the time of coding, and performing bytein processing in the case where the result of subtraction of the subtraction step is not negative at the time of decoding and in the case where the value of the free byte counter CT is not 0 and the value of the free byte counter CT and the number of shifts SHIFT_A are the same value and normalization is carried out, at the time of decoding;
a second left bit shift step of performing left shift of the code register C by bits of the value indicated by the free byte counter CT in the case where byteout processing or bytein processing is performed at the byteout/bytein step, and performing left shift of the code register C by bits of the value indicated by the number of shifts SHIFT_A in the case where byteout processing or bytein processing is not performed at the byteout/bytein step;

a CT value selection step of setting the absolute value of the result of subtraction of the subtraction step as the value of the free byte counter CT in the case where byteout processing or bytein processing is not performed at the byteout/bytein step, and setting the value of the free byte counter CT at 0 in the case where byteout processing or bytein processing is performed at the byteout/bytein step; and a number-of-remaining-loop selection step of setting the value of the number of shifts SHIFT_A at 0 in the case where byteout processing or bytein processing is not performed at the byteout/bytein step, and setting the absolute value of the result of subtraction of the subtraction step as the number of shifts SHIFT_A in the case where byteout processing or bytein processing is performed at the byteout/bytein step, wherein the renormalization means ends the processing if the value of the number of shifts SHIFT_A outputted from the number-of-remaining-loop selection step is 0, and repeats the processing from the subtraction step if the value of the number of shifts SHIFT_A is not 0.

2. An arithmetic coding/decoding apparatus of the MQ-CODER system comprising renormalization means for performing renormalization processing in coding and renormalization processing is decoding based on the MQ-CODER system with reference to the values of an augend register A, a code register C and a free byte counter CT, the renormalization means comprising:

a number-of-shift calculating unit for calculating the number of times of shift in the case where left shift of the value of the augend register A by 1 bit is performed until MSB reaches 1, and outputting the number of times as the number of shifts SHIFT_A;

a first left bit shift unit for performing left shift of the value of the augend register A by bits of the value indicated by the number of shifts SHIFT_A;

a subtracting unit for subtracting the value of the free byte counter CT from the number of shifts SHIFT_A;

a byteout/bytein unit for issuing a byteout processing command in the case where the result of subtraction by the subtracting unit is not negative at the time of coding, and issuing a bytein processing command in the case where the result of subtraction by the subtracting unit is not negative at the time of decoding and in the case where the value of the free byte counter CT is not 0 and the value of the free byte counter CT and the number of shifts SHIFT_A are the same value and normalization is carried out, at the time of decoding;

a second left bit shift unit for performing left shift of the code register C by bits of the value indicated by the free byte counter CT in the case where a byteout processing command or a bytein processing command is issued by the byteout/bytein unit, and performing left shift of the code register C by bits of the value indicated by the number of shifts SHIFT_A in the case where a byteout processing command or a bytein processing command is not issued by the byteout/bytein unit;

a CT value selecting unit for setting the absolute value of the result of subtraction by the subtracting unit as the value of the free byte counter CT in the case where a byteout processing command or a bytein processing command is not issued by the byteout/bytein unit, and setting the value of the free byte counter CT at 0 in the case where a byteout processing command or a bytein processing command is issued by the byteout/bytein unit; and a number-of-remaining-loop selecting unit for setting the value of the number of shifts SHIFT_A at 0 in the case where a byteout processing command or a bytein processing command is not issued by the byteout/bytein unit, and setting the absolute value of the result of subtraction by the subtracting unit as the number of shifts SHIFT_A in the case where a byteout processing command or a bytein processing command is issued by the byteout/bytein unit.

3. A renormalization method used in arithmetic coding/decoding processing of the MQ-CODER system for performing renormalization processing in coding and renormalization processing in decoding with reference to the values of au augend register A, a code register C and a free byte counter CT, the method comprising:

a number-of-shift calculation step of calculating the number of times of shift in the case where left shift of the value of the augend register A by 1 bit is performed until MSB reaches 1, and outputting the number of times as the number of shifts SHIFT_A;

a first left bit shift step of performing left shift of the value of the augend register A by bits of the value indicated by the number of shifts SHIFT_A;

a subtraction step of subtracting the value of the free byte counter CT from the number of shifts SHIFT_A;

a byteout/bytein step of performing byteout processing in the case where the result of subtraction of the subtraction step is not negative at the time of coding, and performing bytein processing in the case where the result of subtraction of the subtraction step is not negative at the time of decoding and in the case where the value of the free byte counter CT is not 0 and the value of the free byte counter CT and the number of shifts SHIFT_A are the same value and normalization is carried out, at the time of decoding;

a second left bit shift step of performing left shift of the code register C by bits of the value indicated by the free byte counter CT in the case where byteout processing or bytein processing is performed at the byteout/bytein step, and performing left shift of the code register C by bits of the value indicated by the number of shifts SHIFT_A in the case where byteout processing or bytein processing is not performed at the byteout/bytein step;

a CT value selection step of setting the absolute value of the result of subtraction of the subtraction step as the value of the free byte counter CT in the case where byteout processing or bytein processing is not performed at the byteout/bytein step, and setting the value of the free byte counter CT at 0 in the case where byteout processing or bytein processing is performed at the byteout/bytein step; and a number-of-remaining-loop selection step of setting the value of the number of shifts SHIFT_A at 0 in the case where byteout processing or bytein processing is not performed at the byteout/bytein step, and setting the absolute value of the result of subtraction of the subtraction step as the number of shifts SHIFT_A in the case where byteout processing or bytein processing is performed at the byteout/bytein step;

wherein the processing ends if the value of the number of shifts SHIFT_A outputted from the number-of-remaining-loop selection step is 0, and the processing is repeated from the subtraction step if the value of the number of shifts SHIFT_A is not 0.

* * * * *